United States Patent
Bilbao De Mendizabal

(10) Patent No.: US 11,422,163 B2
(45) Date of Patent: Aug. 23, 2022

(54) CURRENT SENSOR

(71) Applicant: Melexis Technologies SA, Bevaix (CH)

(72) Inventor: Javier Bilbao De Mendizabal, Zurich (CH)

(73) Assignee: MELEXIS TECHNOLOGIES SA, Bevaix (CH)

( * ) Notice: Subject to any disclaimer, the term of this patent is extended or adjusted under 35 U.S.C. 154(b) by 0 days.

(21) Appl. No.: 17/319,673

(22) Filed: May 13, 2021

(65) Prior Publication Data

US 2021/0263078 A1   Aug. 26, 2021

Related U.S. Application Data

(63) Continuation of application No. 16/711,796, filed on Dec. 12, 2019, now Pat. No. 11,047,883.

(30) Foreign Application Priority Data

Dec. 12, 2018 (EP) ..................................... 18212129
Mar. 27, 2019 (EP) ..................................... 19165396

(51) Int. Cl.
*G01R 15/20* (2006.01)

(52) U.S. Cl.
CPC ......... *G01R 15/202* (2013.01); *G01R 15/207* (2013.01)

(58) Field of Classification Search
CPC .. G01R 15/202; G01R 15/207; G01R 15/205; G01R 15/20; G01R 19/25; G01R 19/32
USPC .......................... 324/117 H, 105, 76.11, 71.1
See application file for complete search history.

(56) References Cited

U.S. PATENT DOCUMENTS

| | | | |
|---|---|---|---|
| 2016/0223699 A1* | 8/2016 | Peczalski | G01R 15/205 |
| 2017/0184635 A1 | 6/2017 | Ugge et al. | |
| 2017/0184636 A1 | 6/2017 | Racz et al. | |
| 2018/0031391 A1* | 2/2018 | Franke | G01D 5/145 |
| 2018/0059148 A1* | 3/2018 | Geisler | G01R 15/202 |
| 2018/0299493 A1* | 10/2018 | Peccoux | G01R 15/202 |
| 2018/0340990 A1* | 11/2018 | Latham | G01L 9/007 |
| 2020/0333380 A1 | 10/2020 | Vuillermet et al. | |

FOREIGN PATENT DOCUMENTS

| | | |
|---|---|---|
| DE | 10154498 A1 | 5/2003 |
| EP | 3109658 A1 | 12/2016 |
| JP | 2005195427 A | 7/2005 |
| WO | 2012029439 A1 | 3/2012 |
| WO | 2015133621 A1 | 9/2015 |
| WO | 2019038964 A1 | 2/2019 |

OTHER PUBLICATIONS

European Search Report from EP Application No. EP19165396, dated Oct. 7, 2019.

* cited by examiner

*Primary Examiner* — Tung X Nguyen
*Assistant Examiner* — Robert P Alejnikov, Jr.
(74) *Attorney, Agent, or Firm* — Workman Nydegger

(57) ABSTRACT

A current sensor is disclosed. The current sensor is substantially immune to stray fields due to the position and orientation of at least two magnetic field sensors and their respective axes of maximum sensitivity, as well as a total current sensor output that is a based on a difference of the individual magnetic field sensor outputs. The specific position and orientation of the magnetic field sensors allows for the current sensor to be smaller than known sensors of similar sensitivity.

14 Claims, 7 Drawing Sheets

Assuming:
* sensors are sensitive in Z-direction,
* sensors have same sensitivity (s1=s2),
* $\alpha \neq 90°$, $\beta = 90°$ $$\begin{cases} v1 = S \cdot Btot1z & [1] \\ v2 = S \cdot Btot2z & [2] \\ Btot1z = Bextz + \cos(\alpha) \cdot Bind1 = Bextz + \cos(\alpha) \cdot K1 \cdot I & [3] \\ Btot2z = Bextz & [4] \end{cases}$$

measure: v1, v2
known from calibration: S, $\cos(\alpha) \cdot K1$
unknown: Btot1, Btot2, I, Bextz
4 equations with 4 unknowns => 1 solution For example, [3] in [1], [4] in [2], and [1]-[2], yields:

$$\begin{aligned} v1 - v2 &= S \cdot (Btot1 - Btot2) \quad &[5] \\ &= S \cdot (Bextz + \cos(\alpha) \cdot K1 \cdot I) - S \cdot (Bextz) \\ &= S \cdot \cos(\alpha) \cdot K1 \cdot I \\ &= I \cdot K3 \;;\; \text{with } K3 = S \cdot \cos(\alpha) \cdot K1 \end{aligned}$$

thus:
$\quad I = (v1 - v2)/K3 \quad\quad$ [6], or
$\quad I = (v1 - v2) \cdot K4 \quad\quad$ [7]

FIG. 5

CURRENT SENSOR

FIELD OF THE INVENTION

The present invention relates in general to the field of current sensors, and more in particular to magnetic current sensors.

BACKGROUND OF THE INVENTION

Different kinds of current sensors are known in the art, for example (1) current sensors using a shunt resistor, (2) using a current transformer, (3) or using a magnetic sensor.

In current sensors using a shunt resistor, a voltage is measured over the shunt resistor, and the current value can be determined by dividing the measured voltage value and the resistor value. A disadvantage of this type is that the measurement circuit is not electrically isolated from the load. A current transformer includes primary and secondary coils. While this type of current sensor provides galvanic separation, it is usually very bulky. Current sensors based on magnetic sensors provide both galvanic separation and can be very compact. A problem with this kind of current sensor is that it is sensitive to an external disturbance field (also referred to as "strayfield"), unless explicitly cancelling such field.

US20170184635(A1) describes a magnetic current sensor comprising an electrical conductor and a plurality of sensor elements arranged in differential pairs. Multiple pairs are used to increase the dynamic range of this current sensor.

There is always room for improvements or alternatives.

SUMMARY OF THE INVENTION

It is an object of embodiments of the present invention to provide a magnetic current sensor which is highly insensitive to an external disturbance field.

It is an object of embodiments of the present invention to provide a magnetic current sensor which is more compact.

It is an object of particular embodiments of the present invention to provide a current sensor with an integrated electrical conductor which is easier and/or cheaper to produce.

It is an object of particular embodiments of the present invention to provide a current sensor which can more easily be mounted or aligned to an external electrical conductor.

It is an object of particular embodiments of the present invention to provide a current sensor capable of measuring and providing the current value to be measured, but also capable of measuring and providing an external disturbance field (if present).

It is an object of particular embodiments of the present invention to provide a current sensor capable of measuring a relatively high current (e.g. a current of at least 30 Amperes).

These and other objects are accomplished by a current sensor according to embodiments of the present invention.

According to a first aspect, the present invention provides a current sensor device for measuring an electrical current, the current sensor device comprising: a substrate mounted at a predefined position with respect to an electrical conductor and comprising or connected to a first magnetic sensor and a second magnetic sensor; wherein the electrical conductor has a symmetry plane along a major axis of the electrical conductor, the symmetry plane oriented substantially perpendicular to the substrate; wherein the first magnetic sensor is located at a first location spaced from the symmetry plane, and has a first axis of maximum sensitivity, and is configured for providing a first value indicative of a first magnetic field component induced by the current to be measured at said first location; wherein the second magnetic sensor has a second axis of maximum sensitivity parallel to the first axis and to said symmetry plane, and wherein the second magnetic sensor is located at a second location situated in the symmetry plane, and is configured for providing a second value indicative of an external disturbance field, if present; a processing circuit connected to the first magnetic sensor for obtaining the first value, and connected to the second magnetic sensor for obtaining the second value, and adapted for determining the current to be measured at least based on a difference between the first value and the second value.

The processing circuit may be integrated on said substrate.

In other words, the first sensor location is situated "at a non-zero distance from" the symmetry plane, whereas the second sensor location is situated "at zero distance from" the symmetry plane.

It is an advantage of calculating the current based on a difference between two sensors having parallel axes of maximum sensitivity, because this allows to determine the current in a manner which is substantially stray field immune. It is an advantage of calculating the current based on a weighted difference, because it additionally allows to compensate for sensitivity-mismatch.

The present invention is partly based on the insight that, in order to measure the current in a manner which is insensitive to an external disturbance field, it is not absolutely necessary to align or position the two magnetic sensors symmetrically with respect to the centre line of the conductor, but the common mode rejection also works if the two sensor elements are located and oriented as recited in claim 1. The present invention is based on a second insight that it is possible to arrange one of the magnetic sensors such that it does not measure a magnetic field generated by the current. This is contrary to the classical current sensor arrangements, where one always tries to measure the magnetic field twice, in order to get a signal which is two times higher.

It is a major advantage of locating the second sensor in the symmetry plane, rather than at an opposite edge of the conductor, because it allows the size of the classical substrate to be reduced to only about half of its size. For example, the substrate width can be chosen smaller than the width of the conductor, for example only 60% to 90% thereof. This advantage should not be underestimated, because the cost of the substrate constitutes a significant portion of the total cost of the current sensor. This is especially important in a highly competitive market, such as automotive.

It is an advantage that the present invention works for conductors with various cross sectional shapes (for example circular, elliptical, square, rectangular, trapezoidal, etc.) as long as the conductor has a cross section with a symmetry plane, over its entire length, or over only a portion of its length.

In an embodiment, the current to be determined is based on a weighted difference of the first value (v1) and the second value (v2), and the respective weight factors (A, B) are chosen such that a uniform external magnetic field is cancelled. The weight factors may for example be determined during a calibration test and stored in a non-volatile memory, and retrieved from the non-volatile memory during actual use.

In an embodiment, a first angle α defined by the first axis of maximum sensitivity and the first magnetic field vector B1 is an angle substantially different from 90° and substantially different from 270°; and a second angle β defined by the second axis of maximum sensitivity and the second magnetic field vector B2 is substantially equal to 90° or substantially equal to 270°.

For example, the first angle may be an angle in the range from 0° to 88° or from 92° to 268° or from 272° to 360°, or from 50° to 88°, or from 272° to 310°, or from 50° to 85°, or from 275° to 310°.

The second angle may be an angle in the range from 89° to 91° or from 269° to 271°.

In an embodiment, each of the first and second magnetic sensor comprises at least one Horizontal Hall element, each having an axis of maximum sensitivity in a direction perpendicular to the substrate.

In an embodiment, the substrate has an area in the range from 1 to 7 mm², or from 2 to 7 mm², or from 1 to 5 mm².

In an embodiment, the current sensor device is a packaged device (also known as "semiconductor chip"), and the substrate is a semiconductor substrate (e.g. a silicon substrate) comprising said first and second magnetic sensor (preferably in the form of horizontal Hall plates), and the electrical conductor is an internal electrical conductor. Such a current sensor device is typically referred to as an "integrated current sensor" or a "current sensor with an integrated electrical conductor".

It is a major advantage of integrating the electrical conductor, because it allows a highly accurate positioning of the substrate relative to the electrical conductor, in contrast to a system comprising a current sensor device which is mounted in the vicinity of an external electrical conductor, for example on a PCB (printed circuit boards). The positioning tolerances of an integrated current sensor are typically an order of magnitude more accurate than positioning tolerances of a chip on a PCB, or on an electrical conductor. All other aspects remaining the same, this means that a current sensor with an embedded electrical conductor has a much higher accuracy than a current sensor mounted to an external electrical conductor, unless additional measures are taken, such as a calibration test by the end customer in the application.

The current sensor device may be produced for example by: a) providing the leadframe comprising the electrical conductor; b) optionally providing an insulating material on the electrical conductor; c) mounting a substrate on the electrical conductor or on the insulating material; d) electrically connecting the second leads and the substrate (e.g. by applying bond wires); e) overmolding the leadframe and the substrate.

In an embodiment the electrical conductor has a beam shaped conductor portion having a width of about 4.0±0.5 mm, and the substrate has a size of 2±0.5 mm by 3±0.5 mm.

In an embodiment, the electrical conductor is substantially beam shaped, or has a beam shaped conductor portion, and the electrical conductor has an electrical resistance smaller than 0.30 mOhm, or smaller than 0.28 mOhm, or smaller than 0.26 mOhm.

In an embodiment, the electrical conductor has a planar beam shape with a constant width extending from one end of the chip package to the opposite end of the chip package, spanning the entire distance between the input leads and output leads.

It is an advantage that the electrical resistance is smaller than 0.30 mOhm, because it allows the current sensor device to conduct a current of at least 30 Amperes through the (integrated) electrical conductor (with peak currents up to 100 Amps).

The "electrical conductor" may be formed as part of the leadframe and be formed between and connected to a plurality of first input leads and first output leads (not shown).

The first input leads and the first output leads may be located on opposite sides of the (typically rectangular) device package.

Preferably the beam shaped conductor portion extends over a major portion of the electrical conductor.

It is an advantage of embodiments where the electrical conductor is substantially beam shaped over a major portion of its length, e.g. over at least 70% or 80% of its length, because such a leadframe is easy to produce (e.g. by stamping or etching), preferably without slits or openings or zig-zag or the like. This is also advantageous for mechanical stability, and thermal heat dissipation of the current sensor device.

Preferably the conductor has a conductor portion with a constant cross section in close vicinity of the first and second magnetic sensor.

In an embodiment, the electrical conductor is formed as part of the leadframe; and the leadframe is a copper leadframe having a thickness in the range from 100 to 600 micron, or from 200 to 500 micron, e.g. substantially equal to 200 micron, or substantially equal to 250 micron.

It is not trivial to build a current sensor device capable of measuring a current of at least 30 Amps or at least 40 Amps or at least 50 Amps using an internal conductor formed as part of the leadframe with a thickness in the range from 100 to 400 micron, or equal to about 200 or about 250 micron, inter alia because the classical manner to reduce the electrical conductance of an integrated conductor in current sensor devices is by increasing the thickness of the conductor while keeping the width of the conductor unchanged, because otherwise, if the width is increased and the thickness remains the same, the size of the substrate needs to increase (and thus also the cost).

In an embodiment, a distance between a virtual line through the first sensor location and perpendicular to the substrate and an edge of the electrical conductor is less than 10% or less than 20% of a width We or diameter Dc of the electrical conductor.

The magnetic field strength is typically relatively large near the edge of the electrical conductor. Hence, in this embodiment, the signal v1 is relatively large, thus providing both a good SNR, and at the same time a relatively small substrate size.

In an embodiment, a distance Δx between the first sensor location and the second sensor location is a value in the range from 1.0 mm to 3.0 mm, or in the range from 1.0 mm to 2.5 mm.

In an embodiment, the substrate has a first surface containing the first and second magnetic sensor, and the first surface is facing the electrical conductor; and the current sensor device further comprises an electrical isolating material located between the substrate and the electrical conductor. The electrical isolating material may be a polyamide layer as part of the semiconductor die (e.g. CMOS device), or may be an electrically insulating tape applied between the leadframe and the semiconductor die.

It is an advantage of this embodiment that the distance between the magnetic sensors and the electrical conductor is relatively small, and that the signal measured by the sensors is relatively large (e.g. larger than in case the second surface was facing the electrical conductor). This improves Signal-To-Noise ratio, and thus the accuracy of the measurement.

In this embodiment, the substrate is preferably mechanically supported at a first region or first end by the electrical conductor portion and the isolation material.

The substrate may additionally be mechanically supported at an opposite region or opposite end, or may be left floating on the other end, with a gap in between, which gap may be filled by air, or by a mold compound, or by insulation tape or another electrically isolating material (e.g. a suitable polymer).

In an embodiment, the substrate has a first surface containing the first and second magnetic sensor, and the first surface is facing the electrical conductor portion. The distance between the first surface and the electrical conductor may be a value in the range from 150 to 250 μm, or in the range from 170 to 210 μm, for example equal to about 190 micron.

In an embodiment, the electrical isolating material is adapted to withstand a voltage of at least 1000 Volt.

In an embodiment, the substrate has a first surface containing the first and second magnetic sensor, and wherein the first surface is facing away from the electrical conductor.

In this embodiment, an electrical insulating material is not absolutely required between the electrical conductor portion and the substrate, but an electrical insulating material may optionally be present. In embodiments without electrical insulating material, the substrate may be positioned directly on top of the electrical conductor without additional isolation material in between. This is easier to produce (requires less material and less handling), and thus is faster and cheaper to produce.

The distance between the first surface of the substrate and the electrical conductor may be a value in the range from 300 to 400 μm, or in the range from 320 to 380 μm, for example equal to about 350 micron.

In embodiments where the substrate is separated from the electrical conductor portions by means of an electrically insulating tape, the distance between the substrate and the electrical conductor portions may be a value in the range from about 10 to 100 or from 15 to 100 or from 20 to 100 or from 30 to 100 or from 30 to 80 or from 30 to 50 for example equal to about 40 μm.

In an embodiment, the substrate further comprises a plurality of bond pads located on a portion of the substrate overlapping the electrical conductor, and the current sensor device further comprises a plurality of bond wires interconnecting the plurality of bond pads with a plurality of leads.

In an embodiment, the bond pads are located only in a region of the substrate corresponding to a portion of the substrate which is mechanically supported underneath (i.e. is not left floating).

In an embodiment, the substrate further comprises a plurality of solder bumps connected to at least some of the leads, but galvanically separated from the electrical conductor.

The galvanic separation may be implemented by a gap filled with air, or a gap filled with mold compound or a gap filled with an isolating material, e.g. an insulating tape, or the like.

In an embodiment, the electrical circuit comprises a differential amplifier configured for determining and amplifying said difference between the first value and the second value.

In an embodiment, the electrical circuit comprises an amplifier configured for selectively amplifying the first value and the second value, for example by means of a switch in front of the amplifier, and the two amplified signals may be temporarily stored (e.g. on one or more sample and hold circuits) and then subtracted.

In an embodiment, the first sensor signal may be amplified by a first amplifier, and the second sensor sensor may be amplified by a second amplifier, and the two amplified values may be subtracted from one another.

In an embodiment, the current sensor device further comprises a digital processor comprising or connected to a non-volatile memory storing at least one constant value (e.g. a conversion factor), and wherein the digital processor is adapted for determining the current to be measured based on a difference or a weighted difference between the first value and the second value and based on said constant value.

The sensor device may further comprise an analog-to-digital convertor ADC configured for digitizing the amplified difference signal (v1−v2), or for selectively digitizing the first amplified signal and the second amplified signal. The ADC may be part of a digital processor, for example a programmable microcontroller.

The current to be measured may be provided as an analog output signal proportional to the current, or may be provided as a digital signal, which may for example be output via a serial bitstream.

The digital processor may have an input connected to an output of the differential amplifier, in which case the digital processor may be adapted for digitizing the difference signal, and for multiplying the digitized value by said constant value K, for example according to the formula: $I=K \cdot (\Delta V)$, where $\Delta V$ is the digitized difference signal.

Alternatively, the subtraction may be performed in the digital domain. The digital processor may have an input connected to an output of the amplifier, and the digital processor may be adapted for selectively digitizing each of the first amplified signal and the second amplified signal, to perform the subtraction in the digital domain, and to multiply the result by said constant value K to obtain a result which is indicative of the current to be measured, for example according to the formula: $I=K \cdot (V1-V2)$, where V1 is a digitized value of the (optionally amplified) first signal, and V2 is a digitized value of the (optionally amplified) second signal.

In a variant, the digital processor may be adapted to calculate the current using the formula:

$I=(A \cdot V1)-(B \cdot V2)$, where "A" is a first amplification factor (analog or digital) and "B" is a second amplification factor (analog or digital). This embodiment offers the advantage that it can correct for sensitivity mismatch. The value of A and B may be stored in a non-volatile memory, and may be determined during calibration, or in any other suitable way.

In an embodiment, the substrate further comprises at least one temperature sensor configured for measuring at least one temperature related to a temperature of the first magnetic sensor and/or the second magnetic sensor, the at least one temperature sensor being connected to the digital processor; and wherein the digital processor is adapted for calculating the current to be measured based on a difference or a weighted difference between the first value and the second value, and taking into account the at least one measured temperature.

It is an advantage of this current sensor that it includes a temperature compensation mechanism. In this way, the accuracy of the current measurement can be further improved.

In an embodiment, the substrate further comprises a first temperature sensor and a second temperature sensor, the first temperature sensor being configured for measuring a first temperature (T1) of the first magnetic sensor, and the second temperature sensor being configured for measuring a second temperature (T2) of the second magnetic sensor, the first temperature sensor and the second temperature sensor being connected to the digital processor; and the digital processor is adapted for calculating the current to be measured based on a difference or a weighted difference between the first value (v1) and the second value (v2), and taking into account the first temperature and the second temperature.

It is a major advantage of this embodiment that the temperature of each magnetic sensor is measured separately, because the temperature of the first and second magnetic sensor may be substantially different, especially if a relatively high current (e.g. larger than 30 Amps) is being measured, because such a high current typically causes the electrical conductor to warm up significantly, causing a relatively large temperature gradient over the substrate. By measuring and taking into account both temperatures, the accuracy of the current measurement can be further improved. Moreover, the temperature sensor(s) may also be used to detect whether the device is working in its specified operational range. If not, the sensor device may report an error, which error may be used for safety purposes.

In an embodiment, the first magnetic sensor comprises at least a first horizontal Hall element, and the first temperature sensor is substantially surrounding the first horizontal Hall element, and the second magnetic sensor comprises at least a second horizontal Hall element, and the second temperature sensor is substantially surrounding the second horizontal Hall element.

The temperature sensor may be arranged around the horizontal Hall elements in a manner similar as described in patent document EP3109658A1, with or without a stress sensor.

In an embodiment, the substrate further comprises at least one stress sensor configured for measuring at least one stress value related to mechanical stress experienced by the first magnetic sensor, the at least one stress sensor being (e.g. communicatively) connected to the digital processor; and the digital processor is adapted for calculating the current to be measured based on a difference or weighted difference between the first magnetic value and the second magnetic value, and taking into account the at least one measured stress value.

The stress sensor may be arranged around the horizontal Hall element in a manner similar as described in patent document EP3109658A1, but without a temperature sensor.

It is an advantage of this current sensor that it includes a stress compensation mechanism. In this way, the accuracy of the current measurement can be further improved.

In an embodiment, the substrate further comprises a first stress sensor and a second stress sensor, the first stress sensor being configured for measuring a first stress at the first sensor location, and the second stress sensor being configured for measuring a second stress at the second sensor location, the first stress sensor and the second stress sensor being connected to the digital processor, and the digital processor is adapted for calculating the current to be measured based on a difference or a weighted difference between the first magnetic value and the second magnetic value, and taking into account the first stress and the second stress.

It is a major advantage of this embodiment that the (mechanical) stress of each magnetic sensor is measured separately, because the stress exerted upon the first and the second magnetic sensor may be substantially different, especially if a relatively high current (e.g. larger than 30 Amps) is being measured, because such a high current typically causes the electrical conductor to warm up significantly, causing a relatively large temperature gradient, causing mechanical stress (related to different thermal expansion coefficients of the different materials). In this way the accuracy of the current measurement can be further improved.

In an embodiment, the substrate further comprises a first temperature sensor and a first stress sensor surrounding the first magnetic sensor, and a second temperature sensor and a second stress sensor surrounding the second magnetic sensor, the first temperature sensor and the first stress sensor and the second temperature sensor and the second stress sensor being (e.g. communicatively) connected to the digital processor; and wherein the digital processor is adapted for calculating the current to be measured based on a difference between the first magnetic value (optionally amplified with or multiplied by a first factor A) and the second magnetic value (optionally amplified with or multiplied by a second factor B), and taking into account the first and second temperature and the first and second stress, where the factors A and B may be chosen to compensate for sensitivity mismatch.

The temperature sensor and stress sensor may be arranged around the first and second magnetic sensor in a manner similar as described in patent document EP3109658A1. In this way the accuracy of the current measurement can be further improved.

In an embodiment, the current value determined by the processing circuit based on the first and second magnetic sensor is considered as a first current value; and the substrate further comprises a third magnetic sensor arranged in a similar manner as the first magnetic sensor and configured for measuring a third value, and further comprises a fourth magnetic sensor arranged in a similar manner as the second magnetic sensor and configured for measuring a fourth value; and the processing circuit is further connected to the third magnetic sensor for obtaining the third value, and to the fourth magnetic sensor for obtaining the fourth value, and is further adapted for determining a second current value based on a difference or a weighted difference between the third value and the fourth value; and is further adapted for comparing the second current value and the first current value, and if a difference or ratio between the first and second current value satisfies a predetermined condition, to provide an average of the first current value and the second current value as the current value to be measured. Alternatively, either the first current value or the second current value may be provided as "the" current value.

This embodiment may use four magnetic sensors for redundancy purposes and/or for "functional safety" purposes. In case the first and second current value are substantially the same, the average of these currents is provided, which further improves the accuracy.

In case the first and second value deviate too much (e.g. more than a predefined value or more than a predefined percentage), the current sensor device may provide an error signal, for example an analog error signal via one of the second leads, or a digital error value in a serial data stream via one of the second leads.

According to a second aspect, the present invention also provides an assembly comprising: a current sensor device as described above without an internal electrical conductor; and an electrical conductor external to the current sensor device.

According to a third aspect, the present invention also provides a method of manufacturing a current sensor device with an internal electrical conductor having a symmetry plane along its major axis, the method comprising the steps of: a) providing a leadframe comprising an electrical conductor portion adapted to carry the current to be measured, the electrical conductor portion having a symmetry plane along its major axis; b) providing a substrate comprising or connected to at least a first magnetic sensor and comprising or connected to a second magnetic sensor, the first magnetic sensor having a first axis of maximum sensitivity and adapted for providing a first signal, and the second magnetic sensor having a second axis of maximum sensitivity parallel to the first axis, and being adapted for providing a second signal; c) mounting the substrate relative to the leadframe such that the first magnetic sensor is located at a first location spaced from the symmetry plane SP, and such that the first axis of maximum sensitivity is parallel to said symmetry plane SP, and such that the second sensor is situated in the symmetry plane; d) providing a processing circuit connected to the first and second magnetic sensor, and adapted for determining the current to be measured at least based on a difference or a weighted difference of the first value and the second value.

The processing circuit may be embedded on the same substrate as the first magnetic sensor and/or the second magnetic sensor, in which case step d) may be comprised in step b).

In an embodiment, step a) comprises: providing a copper leadframe having a thickness in the range from 100 to 600 micron or from 200 to 500 micron, said copper leadframe comprising a beam shaped conductor portion having an electrical resistance smaller than 0.30 mOhm or smaller than 0.28 mOhm or smaller than 0.26 mOhm.

In an embodiment, the mounting of step c) is performed such that a first angle α defined by the first axis of maximum sensitivity and the first magnetic field vector is an angle substantially different from 90° and substantially different from 270°, and such that a second angle β defined by the second axis of maximum sensitivity and the second magnetic field vector is substantially equal to 90° or substantially equal to 270°.

In an embodiment, the mounting of step c) is performed such that a distance between a virtual line through the first sensor location and perpendicular to the substrate and an edge of the electrical conductor is less than 10% or less than 20% of a width or diameter of the electrical conductor.

In an embodiment, step c) further comprises providing an electrical isolating material on the leadframe and mounting the substrate on said electrical isolating material.

In an embodiment, the method further comprises a step of overmoulding the leadframe and the substrate to produce a packaged device.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

BRIEF DESCRIPTION OF THE DRAWINGS

FIG. 5 shows a set of characteristics and a set of formulas that can be used to determine the current in the sensor devices of FIG. 2 to FIG. 4.

Figure 1:
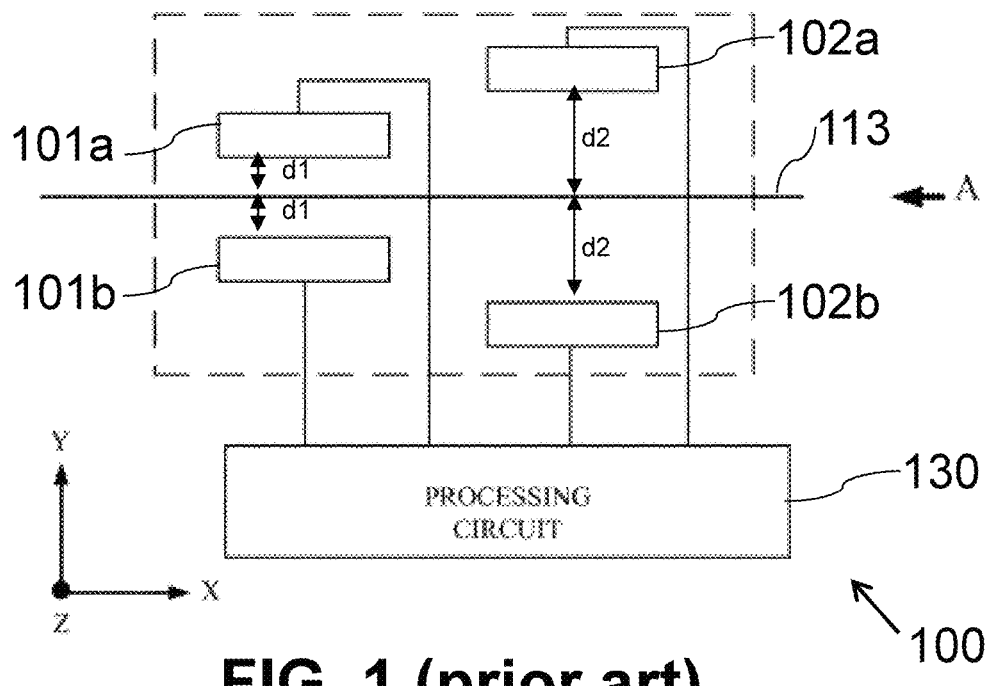
FIG. 1 shows a block diagram of a current sensing apparatus, known in the art.

The drawings are only schematic and are non-limiting. In the drawings, the size of some of the elements may be exaggerated and not drawn on scale for illustrative purposes. Any reference signs in the claims shall not be construed as limiting the scope. In the different drawings, the same reference signs refer to the same or analogous elements.

DETAILED DESCRIPTION OF ILLUSTRATIVE EMBODIMENTS

The present invention will be described with respect to particular embodiments and with reference to certain drawings, but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

The term "magnetic sensor" as used herein may refer to one or more sensor elements capable of measuring one or more magnetic effects, such as the Hall effect, or magnetoresistive (MR) effects. Non-limiting examples for magnetoresistive effects include GMR (giant magnetoresistance), CMR (colossal magnetoresistance), AMR (anisotropic magnetoresistance) or TMR (tunneling magnetoresistance). Depending on the context, the term "magnetic sensor" may refer to a single magnetic sensitive element (e.g. a Horizontal Hall element or a Vertical Hall element), or to a group of magnetic elements (e.g. arranged in a Wheatstone bridge), or to a sub-circuit further comprising one or more of: a biasing circuit, a readout circuit, an amplifier, an Analog-to-Digital converter, etc.

The term "integrated current sensor" as used herein refers to an integrated circuit (chip or IC) comprising an electrical conductor capable of conducting the entire current to be measured. The electrical conductor is typically at least partially surrounded by a mold compound (e.g. in a manner wherein at most one surface is exposed).

When reference is made to "width of the electrical conductor", what is meant is "the local transverse dimension of the electrical conductor at each point of the centerline in a plane perpendicular to the centerline and parallel to the plane defined by the leadframe" unless clear from the context that something else is meant.

When reference is made to "weighted difference", what is meant is a difference between two values after one or both of the values are multiplied by a respective factor. In the context of the present invention, what is meant with "weighted difference of value V1 and value V2" is a value V calculated as $A*V1-B*V2$, where A and B are predefined constants, V1 is the first value, and V2 is the second value.

The present invention relates to current sensors based on magnetic sensors, also referred to as "magnetic current sensors", as may be used in automotive applications (e.g. for measuring a current in electrical or hybrid vehicles). The current sensors described below may be capable of measuring currents of at least 30 Ampere DC with peaks of up to 100 Ampere or up to 120 Ampere.

FIG. 1 is based on FIG. 1 of US20170184635A1, and shows a block diagram of a current sensing apparatus 100, known in the art. The current sensing apparatus comprises one or more pairs of magnetic sensors arranged symmetrically with respect to a conductor 113, which carries a current to be measured. The current generates a magnetic field having an amplitude which increases with the current and decreases with distance. In the example shown in FIG. 1, a first pair of sensor elements 101a, 101b is located at a first distance d1 from the conductor 113. As described in US20170184635A1, the signals from these sensor elements are subtracted in the analogue domain using an operational amplifier to reduce the influence from an external disturbance field. The second pair of sensor elements 102a, 102b is located at a second distance d2 from the conductor 113, and also these signals are subtracted in the analogue domain using an operational amplifier to reduce the influence from the external disturbance field. The processing circuit 130 determines whether saturation occurs, and dependent on the outcome, determines the value of the current using the first differential signal from the first pair or the second differential signal from the second pair, or a combination thereof.

The present invention proposes a current sensor device for measuring an electrical current. The current sensor device comprising a substrate mounted at a predefined position with respect to an electrical conductor. The electrical conductor has a conductor portion with a symmetry plane along its major axis, which is substantially parallel to the direction in which the current will flow during operation. The electrical conductor may be internal (integrated inside the current sensor device) or external (outside the current sensor device). The substrate comprises or is connected to a first magnetic sensor and comprises or is connected to a second magnetic sensor. The first magnetic sensor is located at a first location spaced from the symmetry plane, and has a first axis of maximum sensitivity, and is configured for providing a first value, indicative of a first magnetic field component induced at said first location by the current to be measured. The second magnetic sensor has a second axis of maximum sensitivity parallel to the first axis and parallel to said symmetry plane, and the second magnetic sensor is located at a second location situated in the symmetry plane, and is configured for providing a second value, indicative of an external disturbance field (if present). The current sensor device further comprises a processing circuit connected to the first magnetic sensor for obtaining the first value. The processing circuit is further connected to the second magnetic sensor for obtaining the second value, and is adapted for determining the current to be measured at least based on a difference or a weighted difference between the first value and the second value.

The processing circuit may also be integrated on said substrate.

It is not usual to provide a current sensor device with at least two magnetic sensors arranged in such a way that one of the two sensors is incapable of measuring a magnetic field related to the current to be measured. Yet this arrangement is particularly beneficial for two reasons: 1) to provide a current sensor device which is relatively insensitive to an external disturbance field, and 2) to provide a current sensor device having a relatively small substrate. The latter has an important impact on the cost of the current sensor device, which is very important in highly competitive markets, such as for example automotive.

Referring now to the figures.

FIG. 1 is already described above.

Figure 2A:
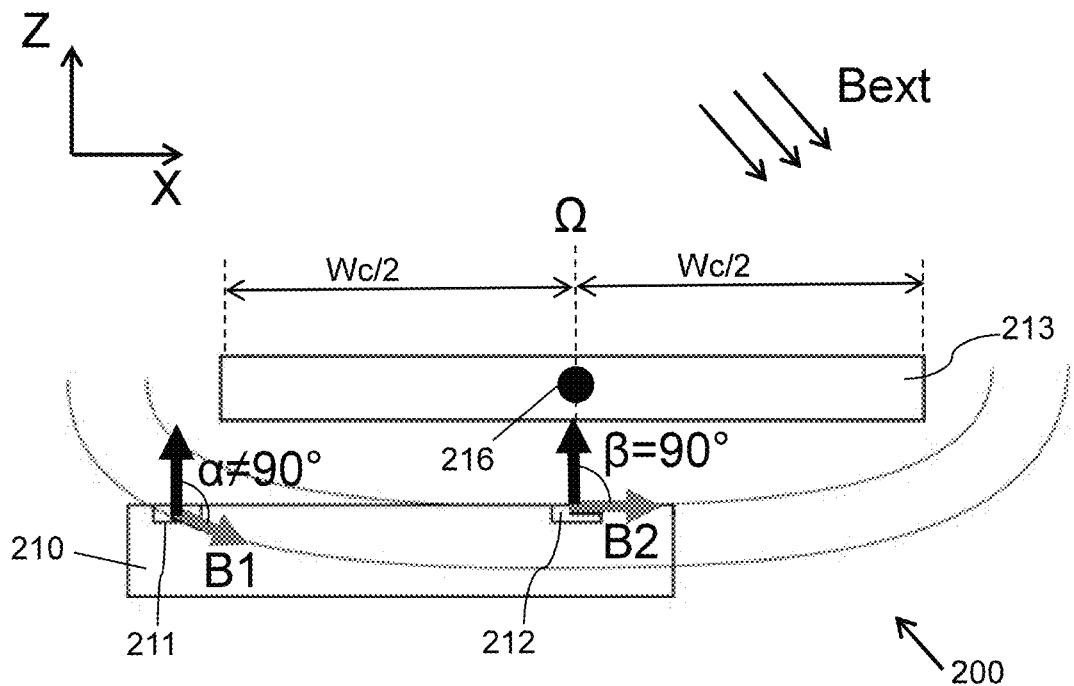
FIG. 2(a) and FIG. 2(b) show an exemplary block diagram of a current sensor device according to an embodiment of the present invention, in top view and in cross sectional view respectively.
Figure 2B:
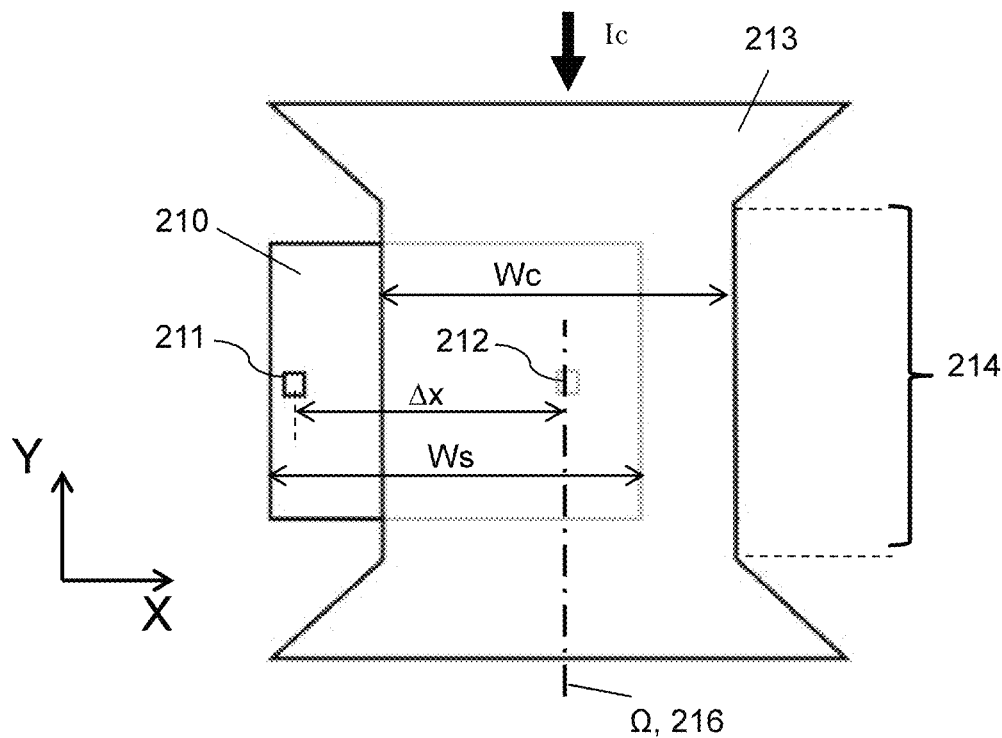

FIG. 2(a) and FIG. 2(b) show an exemplary block diagram of a current sensor device 200 according to an embodiment of the present invention, in top view and in cross sectional view respectively. Many aspects of actual implementations are not illustrated, (such as for example a leadframe, leads or pins, bond wires, bond pads, insulating material, mold compound, etc.).

FIG. 2 shows a current sensor device 200 for measuring an electrical current I which flows through an electrical conductor 213. The electrical conductor may be part of the current sensor device (referred to as: internal conductor or integrated conductor), or may be external to the current sensor device. The current sensor device 200 comprises: a substrate 210 mounted at a predefined position with respect to the electrical conductor 213 and comprises a first magnetic sensor 211 and a second magnetic sensor 212. Each magnetic sensor comprises at least one magnetic sensitive element, for example at least one horizontal Hall element. While not explicitly shown, each magnetic sensor may comprise multiple horizontal Hall elements and/or biasing circuitry or excitation circuitry and/or readout circuitry, and optionally further circuitry. The electrical conductor may be substantially planar, and may have an elongated shape with a beam shaped portion 214. The electrical conductor 213 may have a relatively short or a relatively long beam shaped portion, or even an infinitesimal small beam-shaped conductor portion at the sensor location. The electrical conductor or the beam shaped portion has a symmetry plane Ω containing a centerline 216.

The first magnetic sensor 211 is located at a first location spaced from the symmetry plane Ω by a non-zero distance Δx, and has a first axis of maximum sensitivity (for example illustrated by a black arrow pointing upwards), and is configured for providing a first value v1 indicative of a first magnetic field component (for example the out-of-plane field component B1z) induced by the current I when flowing through the electrical conductor.

The second magnetic sensor 212 has a second axis of maximum sensitivity (also illustrated by a black arrow pointing upwards) parallel to the first axis, and is located at a second location situated on or in the symmetry plane Ω, for example at an intersection of the symmetry plane and the substrate 210. The second magnetic sensor is configured for providing a second value v2 indicative of an external disturbance field (if present), but not of the magnetic field induced by the current I. This is highly unusual, because in prior art current sensors, the two sensors are typically arranged so as to measure opposite values (which are subtracted), or so as to measure a same value twice (which are added), in order to double the signal value.

As far as is known to the inventors, there are no current sensors which deliberately position one of the sensor elements at this location where no signal from the current conductor can be measured. Yet, by doing so, the dimensions of the substrate can be reduced by a factor of about two, while at the same time the influence from an external disturbance field can be reduced. This insight is not known in the prior art. Instead, in prior art current sensors, the sensor elements are typically located at an equal distance from the centerline, maybe because it is falsely believed that the sensor elements must not be located above or below the electrical conductor in order to measure the disturbance field.

The current sensor device 200 further comprises a processing circuit 610; 710 (not shown in FIG. 2, but see for example FIG. 6 and FIG. 7), which processing circuit is preferably integrated on the same substrate 210 and which is connected to the first magnetic sensor 211 for obtaining the first value v1 (indicative of the magnetic field generated by the current), and connected to the second magnetic sensor 212 for obtaining the second value v2 (not indicative of the current, but only indicative of an external magnetic field, if present). As will be described further, the processing circuit is adapted for determining the current at least based on a difference between the first value v1 and the second value v2 or based on a weighted difference between the first value v1 and the second value v2.

When a current to be measured flows through the electrical conductor 213, more in particular through the beam shaped conductor portion 214, a magnetic field is generated which has a first magnetic field vector B1 at the first sensor location, and which has a second magnetic field vector B2 at the second sensor location, as illustrated by the gray arrows.

As shown, the first axis of maximum sensitivity (black arrow) and the first magnetic field vector B1 (gray arrow) define a first angle α which is substantially different from 90° and substantially different from 270°. For example, the first angle α may be an angle in the range from 0° to 88° or from 92° to 268° or from 272° to 360°, or from 50° to 88°, or from 272° to 310°, or from 50° to 85°, or from 275° to 310°.

The second axis of maximum sensitivity (black arrow) and the second magnetic field vector B2 (gray arrow) define a second angle β which is substantially equal to 90° or substantially equal to 270°. For example, the second angle may be an angle in the range from 89° to 91° or from 269° to 271°.

The electrical conductor 213 may be an internal conductor.

The electrical conductor 213 may have a beam shaped conductor portion 214 having a width Wc in the range from 3.0 mm to 5.0 mm. The beam shaped conductor portion may extend over a portion of the full length of the electrical conductor (see FIG. 2), or may extend over the full length of the electrical conductor (see FIG. 3).

The electrical conductor may be formed as part of a leadframe. Such a leadframe (not shown) may comprise a plurality of first input leads and a plurality of first output leads interconnected by the electrical conductor and may further comprise a plurality of second leads (not shown) galvanically separated from the first leads. These second leads may be connected to bond pads (not shown) of the substrate, for example by means of bond wires (not shown).

The leadframe may be a copper leadframe having a thickness in the range from 100 to 600 micron, or from 200 to 500 micron, e.g. substantially equal to 200 micron, or substantially equal to 250 micron.

The electrical conductor 213 may have an electrical resistance smaller than 0.30 mOhm, or smaller than 0.28 mOhm, or smaller than 0.26 mOhm. This can be achieved for example by choosing a suitable leadframe material (e.g. copper) and a suitable length Lc and width Wc and leadframe thickness. Thanks to this low resistance value, the power dissipation caused by a current flowing through the electrical conductor can be limited, thus the temperature increase can be limited.

The first sensor location may be situated at a position (on the substrate) substantially corresponding to an edge of the conductor, or such that a distance between a virtual line through the first sensor location and perpendicular to the substrate and an edge of the electrical conductor is less than 10% or less than 20% of the width Wc (or diameter Dc) of the electrical conductor 213. Since the second sensor location is situated at a position (on the substrate) substantially corresponding to a centerline 216 of the conductor, rather than the opposite edge of the conductor, the substrate size can be reduced by almost a factor of 2.

The distance Δx between the first sensor location and the second sensor location may for example be a value in the range from 1.0 mm to 3.0 mm, or in the range from 1.0 mm to 2.5 mm.

The substrate may have a width Ws smaller than the width Wc of the beam shaped conductor portion. For example, if the beam shaped conductor portion has a width Wc of 4.0 mm, the substrate may have a width Ws in the range from 2.5 to 3.5 mm. The substrate may have an area in the range from 1 to 7 $mm^2$, or from 2 to 7 $mm^2$, or from 1 to 5 $mm^2$, for example a size of 2±0.5 mm by 3±0.5 mm.

While not explicitly shown in FIG. 2, the substrate 210 may further comprise an electrical processing circuit. Examples of processing circuitry will be shown in FIG. 6 and FIG. 7, but the invention is not limited to these examples, and other processing circuits may also be used.

The substrate 210 has a first surface, also referred to as the active surface containing the sensor elements and the processing circuit, and a second surface opposite the first surface.

In the example of FIG. 2 the substrate 210 is located below the electrical conductor 213, and the active surface of the substrate 210 is facing the electrical conductor 213. An electrically insulating layer, e.g. an insulating polymer or an insulating tape (not shown) may be applied between the substrate 210 and the electrical conductor 213.

Alternatively, the first surface of the substrate may be facing away from the conductor. In this case the electrical conductor 213 may be separated from the substrate by an insulating material (as described above) or may be placed directly on top of the substrate (or vice versa) without an additional insulating material in between. An oxide layer or a nitride layer may be provided on the second surface of the substrate, forming an electrical insulating layer.

The electrical isolating material may be adapted to withstand a voltage of at least 1000 Volt.

Instead of or in addition to bond wires, the substrate may also comprise a plurality of solder bumps (e.g. located on the second surface. The solder bumps may be electrically connected to elements or tracks or components on the first surface by means of "through vias". The solder bumps may rest upon and be connected to second leads, but the solder bumps are galvanically separated from the electrical conductor and from the first leads. The galvanic separation may be implemented by a gap filled with air, or a gap filled with mold compound or a gap filled with an isolating material, e.g. an insulating tape, or in any suitable manner.

Figure 3A:
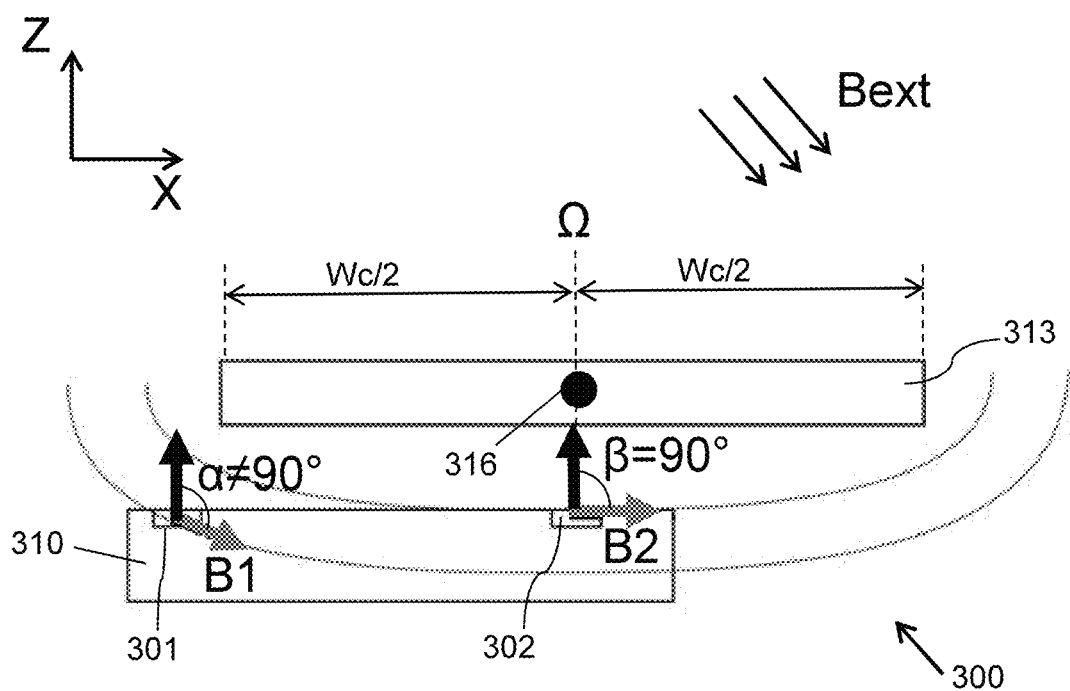
FIG. 3(a) and FIG. 3(b) show an exemplary block diagram of a current sensor device according to another embodiment of the present invention, in top view and in cross sectional view respectively.
Figure 3B:
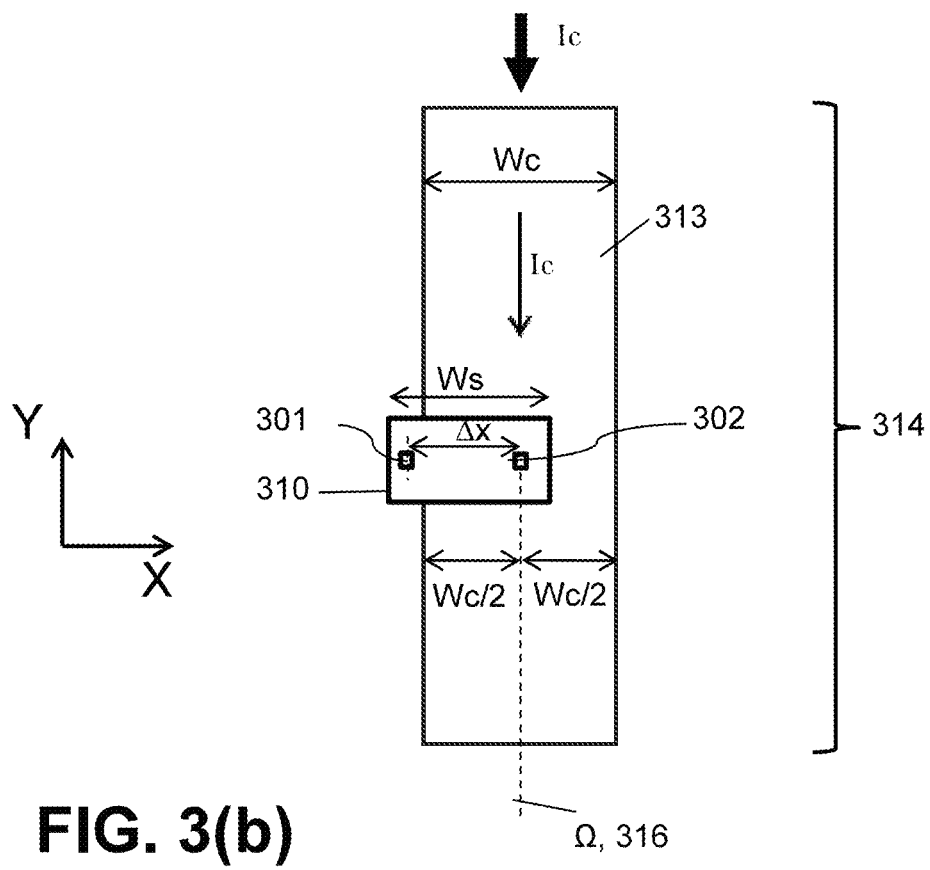

FIG. 3(*a*) and FIG. 3(*b*) show an exemplary block diagram of a current sensor device 300 according to another embodiment of the present invention, in top view and in cross sectional view respectively. The current sensor device 300 is a variant of the current sensor device 200 of FIG. 2. The main difference between the current sensor device 300 of FIG. 3 and the current sensor device 200 of FIG. 2 is that the beam shaped conductor portion 314 extends over substantially the entire length of the electrical conductor 313. The current distribution in such a conductor portion may be relatively uniform, and such a conductor (without slits) may be relatively easy to produce. Everything else described above for the current sensor device 200 of FIG. 2 and variations thereof is also applicable here.

In a variant of FIG. 3(*a*), the electrical conductor is standing upright (vertically) rather than lying horizontally. Or stated in other words, its width We (in the X-direction) may be smaller than its thickness (in the Z-direction).

Figure 4A:
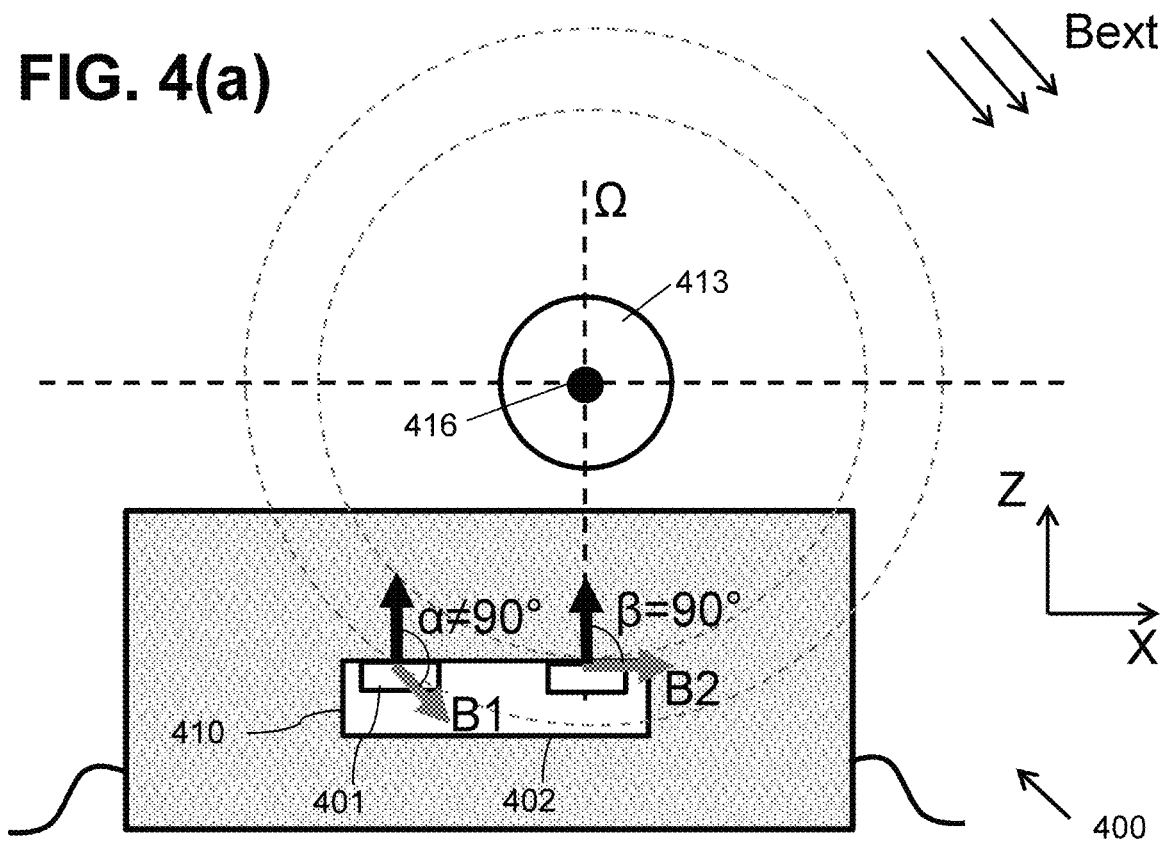
FIG. 4(a) and FIG. 4(b) show an exemplary block diagram of a current sensor device according to another embodiment of the present invention, in top view and in cross sectional view respectively.
Figure 4B:
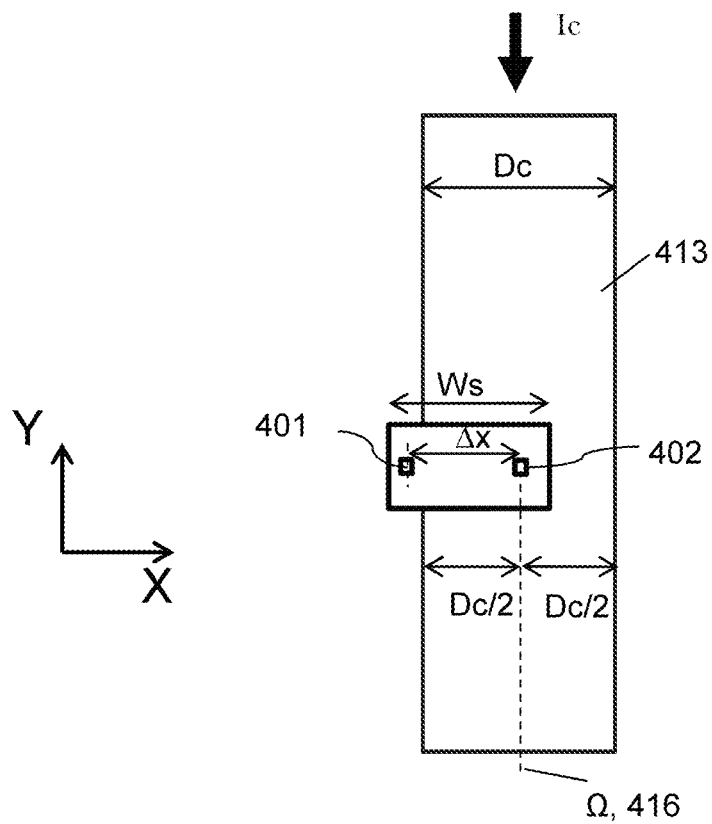

FIG. 4(*a*) and FIG. 4(*b*) show an exemplary block diagram of a current sensor device 400 according to another embodiment of the present invention, in top view and in cross sectional view respectively. The current sensor device 400 is a variant of the current sensor device 200 of FIG. 2. The main differences between the current sensor device 400 of FIG. 4 and the current sensor device 200 of FIG. 2 are: i) that the electrical conductor does not have a beam shape, but a cylindrical shape. The same principles apply however, if the electrical conductor has a symmetry plane S2; ii) that the electrical conductor may be external to the current conductor device. In the example shown in FIG. 4, the substrate 410 is shown embedded in an exemplary plastic package.

FIG. 5 shows a set of characteristics and a set of formulas [1] to [7] that may be used to determine the current in the current sensor device of FIG. 2 to FIG. 4.

Formula [1] expresses that the value measured by the first magnetic sensor is proportional to a Z-component of the total magnetic field at the first sensor location.

Formula [2] expresses that the value measured by the second magnetic sensor is proportional to a Z-component of the total magnetic field at the second sensor location.

Formula [3] expresses that the Z-component of the total magnetic field at the first sensor location is the Z-component of the vector sum of an external disturbance field Bext and a projection of the induced magnetic field vector B1 in the direction of maximum sensitivity. The induced field can be written as a value proportional to the current.

Formula [4] expresses that the Z-component of the total magnetic field at the second sensor location is only equal to the Z-component of the external disturbance field (if present), because cos(β)=0.

By combining these formulas, the current to be measured can be calculated as the difference between the first and second value (v1−v2) divided by a constant K3, or as the difference between the first and second value (v1−v2) multiplied by a constant K4.

The constant K3 and K4 may be determined during the design phase or evaluation phase and be stored in a non-volatile memory of the processing circuit, or hard-coded in the processing algorithm. Of course, the value of K3 or K4 may also be determined during a calibration test and stored in said non-volatile memory during the calibration test, for later use.

As can be appreciated from formula [2] and formula [4], the value of the external field component Bextz, may also be calculated (if desired) as Bextz=v2/S, S being the sensitivity of the second sensor which may be a predefined value, or determined during a calibration, and stored in a non-volatile memory.

As can be seen, formula [1] and formula [2] assume that the sensitivity of the first sensor and the second sensor is exactly the same, but in reality, the sensitivity may be slightly different. For example, the first sensor may measure a value v1=S1*Btot1z, and the second sensor may measure a value v2=S2*Btot2z. It can be shown that the current I to be measured can be calculated by the following formula: I=K*(A*v1−B*v2), A, B and K are constants, which can be determined during a calibration test, and stored in a non-volatile memory. But other formulas may also be used, for example the following formula: I=(K1*v1−K2*v2) where K1 and K2 are constants, which can be determined during a calibration test, and stored in a non-volatile memory. The mathematical expressions (A*v1−B*v2) or (K1*v1−K2*v2) are referred to herein as "weighted difference".

Figure 6:
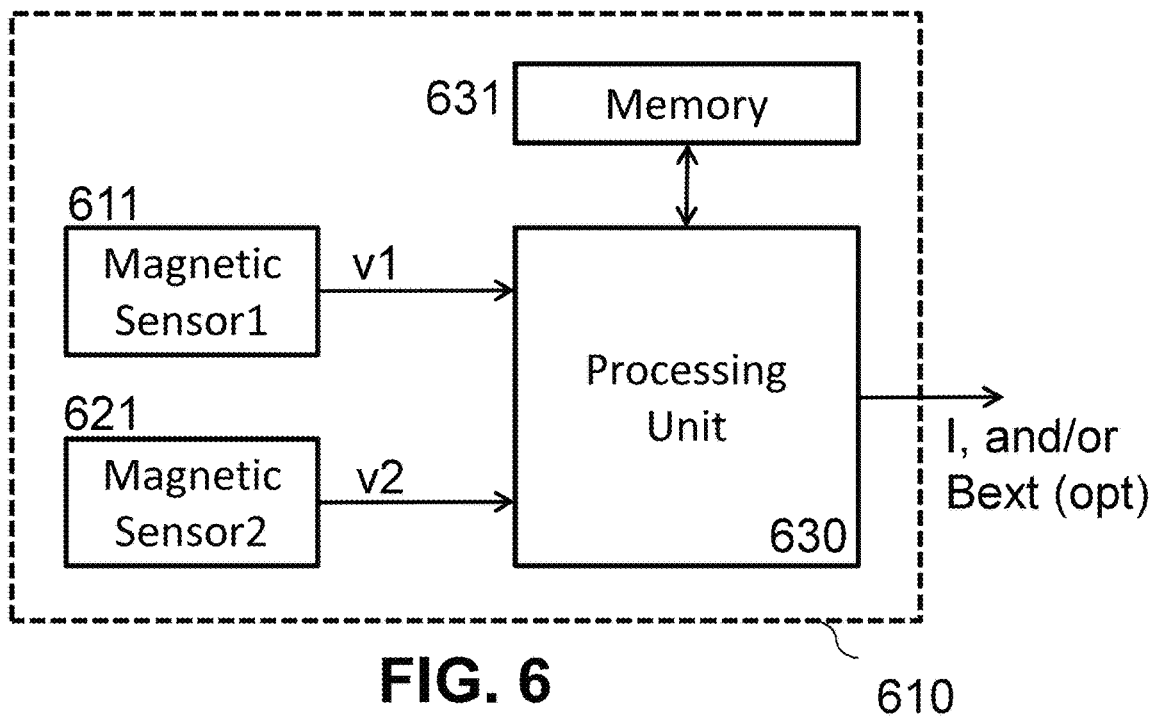
FIG. 6 shows an exemplary block-diagram of an electrical circuit which can be used in embodiments of the present invention.

FIG. 6 shows an electrical block-diagram of a circuit 610 that can be used in a current sensor device, e.g. as shown in FIG. 2 to FIG. 4, in the absence of one or more temperature sensor(s) and one or more stress sensor(s), or at least not taking the values provided by them into account. It is noted that the current conductor is omitted from this drawing, because it is galvanically separated from this processing circuit 610, even though the electrical conductor is physically located in the vicinity of the first and second magnetic sensor 611, 621.

The processing unit 630 is adapted for determining the current to be measured in any known manner, for example using formula [6] or using formula [7] of FIG. 5, or by calculating the current according to the formula: I=K.(v1−v2), where K is a predefined constant (e.g. determined during design or during an evaluation phase), v1 is the value provided by the first magnetic sensor 611 (or a value derived therefrom, e.g. after amplification), and v2 is the value provided by the second magnetic sensor 621. The subtraction may be done in hardware before amplification or after amplification or in the digital domain. The processing unit 630 may comprise a digital processor comprising or connected to a non-volatile memory 631 storing at least one constant value K.

While not explicitly shown, the processing circuit 610 may comprise a differential amplifier configured for determining and amplifying a difference between the first value v1 and the second value v2, and for amplifying this difference in the analogue domain. Alternatively, the processing circuit 610 may comprise an amplifier configured for selectively amplifying the first value v1 and the second value v2. The sensor device may further comprise an analog-to-digital convertor ADC configured for digitizing this amplified difference signal. The ADC may be part of a digital processor circuit. The current to be measured may be provided as an analog output signal proportional to the current or may be provided as a digital signal indicative of the current to be measured. The second leads may be used to provide a supply voltage and a ground signal to the processing circuit 610, and/or to provide a data interface, for example a serial data bus (e.g. using the I2C protocol, or using RS232 protocol, or any other suitable protocol), and/or other input signals or output signals, as desired.

Figure 7:
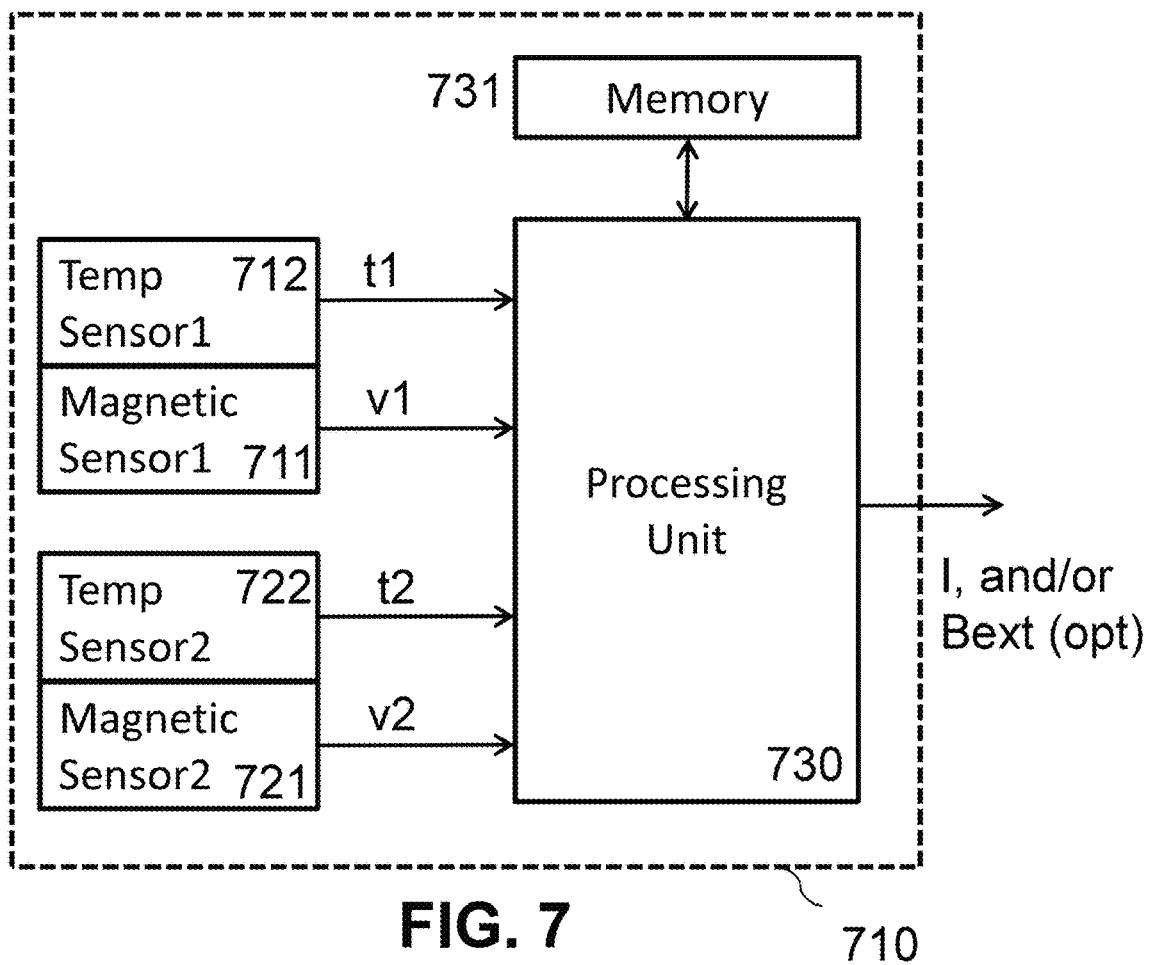
FIG. 7 shows an exemplary block-diagram of an electrical circuit which can be used in embodiments of the present invention.

FIG. 7 shows an electrical block-diagram of a processing circuit 710 which can be seen as a variant of the processing circuit 610 of FIG. 6, further comprising a first and a second temperature sensor 712, 722, communicatively connected to the processing unit 730. The processing unit 730 is adapted for determining the current to be measured based on the values v1 and v2, but taking into account one or both of the temperature signals t1, t2. The measured temperature(s) can be taken into account for compensating the measurement values v1, v2 for temperature variations, e.g. to compensate for sensitivity variations of the sensor elements. Such compensation techniques are known per sé in the art, and hence need not be explained in more detail here. In a particular embodiment, a temperature compensation is performed in a manner similar as described in EP3109658A1, which is incorporated herein by reference in its entirety.

It is an advantage of this current sensor that it includes a temperature compensation mechanism. In this way, the accuracy of the current measurement can be further improved.

The processing unit 630 of FIG. 6 and 730 of FIG. 7 may contain a digital processor, for example a programmable microcontroller. Although not explicitly shown, the circuit 610 and 710 may also contain at least one analog-to-digital convertor, which may be part of the magnetic sensors, or may be part of the processing unit, or may be implemented as a separate circuit (e.g. between an output of the sensor circuit and an input of the processing unit). The block diagram of FIG. 6 and FIG. 7 does not show this level of detail, for the same reasons as it does not show a biasing circuit, a readout circuit, an optional amplifier, a power supply, etc., which are all well known in the art, and hence need not be described in detail here.

It is noted in this respect that if the signals v1, v2, t1 and t2 are analog signals, the processing unit 730 may contain at least one ADC to convert these signals into digital signals, whereas in case the signals v1, v2, t1 and t2 are digital signals, the processing unit 730 need not have an ADC.

It is an advantage of embodiments with two temperature sensors, one for each magnetic sensor, because the temperature of the first and second magnetic sensor may be substantially different, especially if a relatively high current (e.g. larger than 30 Amps) is being measured, because such a high current typically causes the electrical conductor to warm up significantly, causing a relatively large temperature gradient over the substrate. In this way the accuracy of the current measurement can be further improved.

In a variant (not shown) of FIG. 7, the circuit comprises only one temperature sensor, which may be arranged for measuring the temperature of the first magnetic sensor, or for measuring the temperature of the second magnetic sensor. The temperature of the other magnetic sensor may then be estimated based on the estimated power dissipation (in turn based on v1 and v2) and based on an predefined assumption of the ambient temperature, instead of actually measuring the other temperature. Of course, an embodiment with two temperature sensors is more accurate.

In a variant (not shown) of FIG. 7, the circuit comprises one or two stress sensors instead of one or two temperature sensors, and the processing unit 730 is adapted for determining the current based on the values obtained from the magnetic sensors, taking into account the stress value(s) obtained from one or both stress sensors.

In another variant (not shown) of FIG. 7, the circuit additionally comprises one or two stress sensors in addition to one or two temperature sensors, and the processing unit 730 is adapted for determining the current based on the values obtained from the magnetic sensors and the one or more temperature sensors and the one or more stress sensors.

It is also contemplated to provide a current sensor device as shown in any of FIG. 2 to FIG. 4, where the substrate further comprises a third magnetic sensor configured for measuring a third value v3, and further comprises a fourth magnetic sensor configured for measuring a fourth value v4. The third magnetic sensor may be arranged as a backup for the first magnetic sensor (e.g. having the same offset d1 and orientation), and the fourth magnetic sensor may be arranged as a backup for the second magnetic sensor (e.g. having the same offset d2 and orientation). The processing circuit may be adapted to calculate a first current value I1 based on the first and second value v1, v2, and may be further adapted to calculate a second current value I2 based on the third and fourth value v3, v4. Both measurements are stray-field immune. The first current I1 and the second current I2 should ideally be the same, unless the current sensor is malfunctioning.

During use, the circuit can calculate the first and second current, and calculate a difference I1−I2 or a ratio I1/I2, and if the difference is smaller than a predefined threshold, or if the ratio lies within predefined boundaries, the circuit can conclude that the measurements are correct, and if the calculated difference or ratio lies outside said boundaries, the circuit can conclude that the measurements are incorrect. If the circuit is designed such that the predefined value of R is about equal to 1, then the circuit may provide the average of I1 and I2 in case the measurement is correct. In this way, the SNR can be further improved. The embodiment with four magnetic sensors can be used for redundancy and functional safety purposes.

Figure 8:
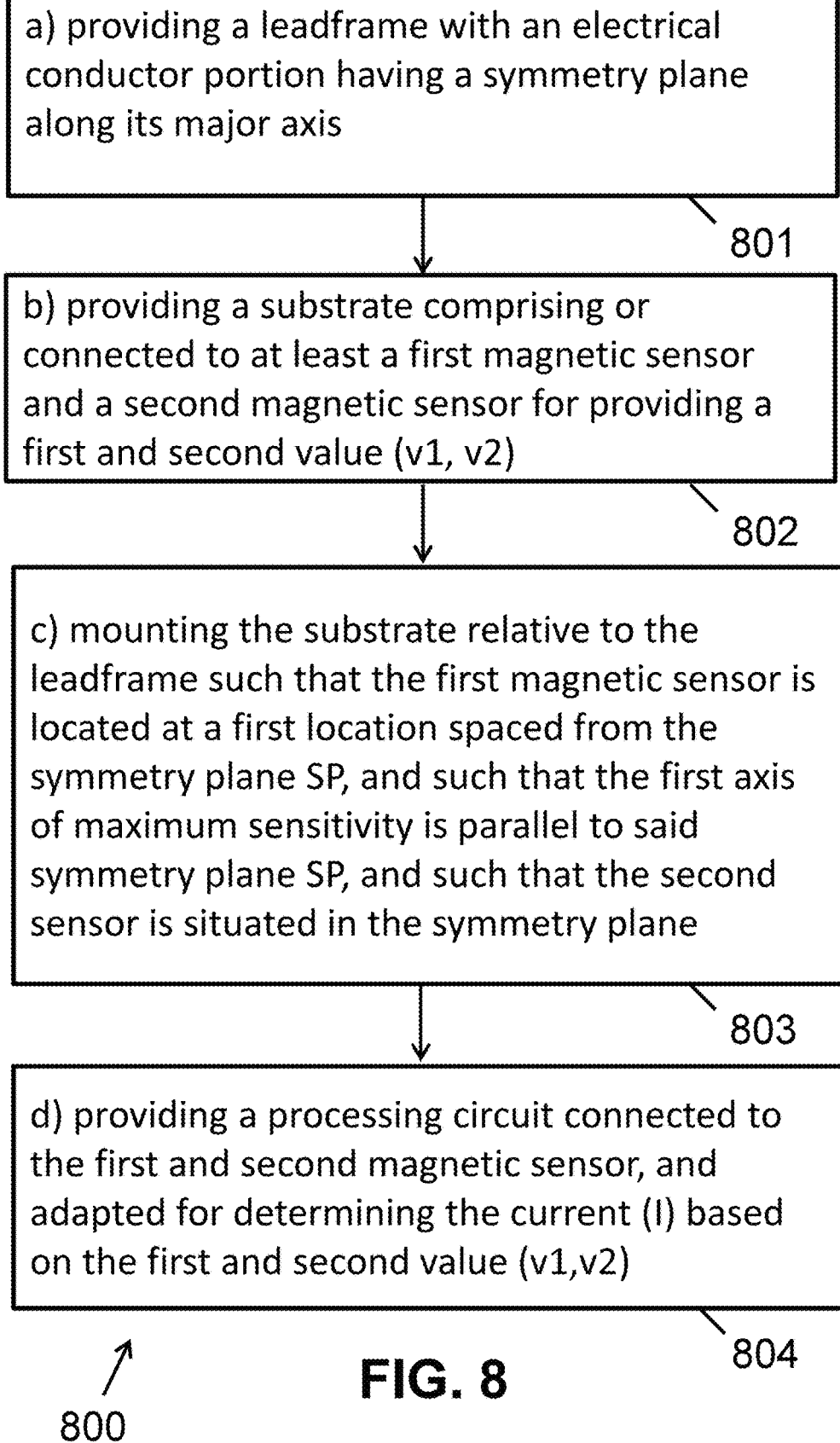
FIG. 8 shows a flow chart of an exemplary method of producing a current sensor according to embodiments of the present invention.

FIG. 8 shows a flow chart of an exemplary method 800 of producing a current sensor with an integrated conductor portion. The method comprises the following steps:
a) providing 801 a leadframe comprising an electrical conductor portion adapted to carry the current to be measured, the electrical conductor portion having a symmetry plane along its major axis;
b) providing 802 a substrate comprising or connected to at least a first magnetic sensor and comprising or connected to a second magnetic sensor, the first magnetic sensor having a first axis of maximum sensitivity and adapted for providing a first signal v1, and the second magnetic sensor having a second axis of maximum sensitivity parallel to the first axis, and being adapted for providing a second signal v2;
c) mounting 803 the substrate relative to the leadframe such that the first magnetic sensor is located at a first location spaced from the symmetry plane SP, and such that the first axis of maximum sensitivity is parallel to said symmetry plane SP, and such that the second sensor is situated in the symmetry plane. This ensures that the first sensor is configured for providing the first value indicative of the current to be measured, and the second sensor is configured for providing the second value indicative only of an external disturbance field (if present), but not indicative of the current to be measured;
d) providing 804 a processing circuit connected to the first and second magnetic sensor and adapted for determining the current I to be measured at least based on a difference or a weighted difference of the first value v1 and the second value v2.

While individual features are explained in different drawings and different embodiments of the present invention, it is contemplated that features of different embodiments can be combined, as would be obvious to the skilled person, when reading this document.

The invention claimed is:

1. A current sensor device for measuring an electrical current, the current sensor device comprising:
 a semiconductor substrate mounted at a predefined position with respect to an electrical conductor and comprising a first magnetic sensor and a second magnetic sensor, wherein each of the first and second magnetic sensor comprises at least one Horizontal Hall element, each having an axis of maximum sensitivity in a direction perpendicular to the semiconductor substrate;
 wherein the electrical conductor has a symmetry plane along a major axis of the electrical conductor, the symmetry plane oriented substantially perpendicular to the semiconductor substrate;
 wherein the semiconductor substrate has a width (Ws) smaller than a smallest width (Wc) of the electrical conductor, measured in a direction perpendicular to the symmetry plane;
 wherein the first magnetic sensor is located at a first location, and has a first axis of maximum sensitivity parallel to said symmetry plane, and is configured for providing a first value indicative of a first magnetic field component measured at said first location;
 wherein the second magnetic sensor has a second axis of maximum sensitivity parallel to the first axis, and wherein the second magnetic sensor is located at a second location different from the first location, and is configured for providing a second value indicative of a second magnetic field component measured at said second location;
 a processing circuit integrated in the semiconductor substrate, and connected to the first magnetic sensor for obtaining the first value, and connected to the second magnetic sensor for obtaining the second value, and adapted for determining the current to be measured at least based on a difference between the first value and the second value.

2. A current sensor device according to claim 1, wherein the width (Ws) of the semiconductor substrate is 60% to 90% of the smallest width (Wc) of the electrical conductor.

3. A current sensor device according to claim 1, wherein the electrical conductor has a beam shaped conductor portion having a width of about 4.0±0.5 mm, and the semiconductor substrate has a width of 2±0.5 mm by 3±0.5 mm.

4. The current sensor device according to claim 1, wherein a distance (Δx) between the first sensor location and the second sensor location is a value in a range from 1.0 mm to 3.0 mm.

5. The current sensor device according to claim 1, wherein the semiconductor substrate has an area in a range from 1 to 7 mm$^2$ or in a range from 2 to 7 mm$^2$, or in a range from 1 to 5 mm$^2$.

6. A current sensor device according to claim 1, wherein the current sensor device is a packaged device; and wherein the electrical conductor is external to the packaged device.

7. The current sensor device according to claim 1, wherein a distance between a virtual line through the first sensor location and perpendicular to the substrate and an edge of the electrical conductor is less than 10% or less than 20% of a width or diameter of the electrical conductor.

8. The current sensor device according to claim 1,
wherein the semiconductor substrate has a first surface containing the first and second magnetic sensor, and wherein the first surface is facing the electrical conductor;
and wherein the current sensor device further comprises an electrical isolating material located between the semiconductor substrate and the electrical conductor.

9. The current sensor device according to claim 1,
wherein the semiconductor substrate has a first surface containing the first and second magnetic sensor, and wherein the first surface is facing away from the electrical conductor.

10. The current sensor device according to claim 1,
wherein the electrical circuit comprises a differential amplifier configured for determining and amplifying said difference between the first value and the second value, or wherein the electrical circuit comprises an amplifier configured for selectively amplifying the first value and the second value;
and/or wherein the current sensor device further comprises a digital processor comprising or connected to a non-volatile memory storing at least one constant value, and wherein the digital processor is adapted for determining the current to be measured based on a difference or weighted difference between the first value and the second value and based on said constant value.

11. The current sensor device according to claim 10,
wherein the semiconductor substrate further comprises at least one temperature sensor configured for measuring at least one temperature related to a temperature of the first magnetic sensor and/or the second magnetic sensor, the at least one temperature sensor being connected to the digital processor;
and wherein the digital processor is adapted for calculating the current to be measured based on a difference between the first value and the second value, and taking into account the at least one measured temperature.

12. The current sensor device according to claim 10,
wherein the semiconductor substrate further comprises at least one stress sensor configured for measuring at least one stress value related to mechanical stress experienced by the first magnetic sensor, the at least one stress sensor being connected to the digital processor; and
wherein the digital processor is adapted for calculating the current to be measured based on a difference between the first magnetic value and the second magnetic value, and taking into account the at least one measured stress value.

13. The current sensor device according to claim 1,
wherein the current value determined by the processing circuit based on the first and second magnetic sensor is considered as a first current value;
and wherein the semiconductor substrate further comprises a third magnetic sensor arranged in a similar manner as the first magnetic sensor and configured for measuring a third value, and further comprises a fourth magnetic sensor arranged in a similar manner as the second magnetic sensor and configured for measuring a fourth value;
and wherein the processing circuit is further connected to the third magnetic sensor for obtaining the third value and to the fourth magnetic sensor for obtaining the fourth value, and is further adapted for determining a second current value based on a difference between the third value and the fourth value, and is further adapted for comparing the second current value and the first current value, and if a difference or ratio between the first and second current value satisfies a predetermined condition, to provide an average of the first current value and the second current value as the current value.

14. An assembly comprising:
the current sensor device according to claim 1;
wherein the electrical conductor is external to the current sensor device.

* * * * *